United States Patent
Tanaka et al.

(10) Patent No.: US 8,002,896 B2
(45) Date of Patent: Aug. 23, 2011

(54) SHADOW FRAME WITH CROSS BEAM FOR SEMICONDUCTOR EQUIPMENT

(75) Inventors: Sakae Tanaka, Goka-machi (JP);
Qunhua Wang, San Jose, CA (US);
Sanjay Yadav, Redwood City, CA (US);
Quanyuan Shang, Saratoga, CA (US);
William R. Harshbarger, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 351 days.

(21) Appl. No.: 11/248,385

(22) Filed: Oct. 11, 2005

(65) Prior Publication Data
US 2006/0030088 A1    Feb. 9, 2006

Related U.S. Application Data

(62) Division of application No. 10/136,249, filed on Apr. 25, 2002, now Pat. No. 6,960,263.

(51) Int. Cl.
*C23C 16/04* (2006.01)
*C23F 1/00* (2006.01)
*H01L 21/306* (2006.01)
*C23C 16/06* (2006.01)
*C23C 16/22* (2006.01)

(52) U.S. Cl. .................................. 118/720; 156/345.1

(58) Field of Classification Search .................. 118/720; 156/345.1
See application file for complete search history.

(56) References Cited

U.S. PATENT DOCUMENTS

| | | | |
|---|---|---|---|
| 3,608,518 A | | 9/1971 | Poole |
| 3,887,421 A | * | 6/1975 | Hudson et al. ............ 156/280 |
| 4,194,930 A | | 3/1980 | Tanaka et al. |
| 4,443,930 A | * | 4/1984 | Hwang et al. ............ 438/299 |
| 5,093,151 A | | 3/1992 | van den Berg et al. |
| 5,216,806 A | * | 6/1993 | Lam ............................ 29/848 |
| 5,332,443 A | | 7/1994 | Chew et al. |
| 5,380,566 A | | 1/1995 | Robertson et al. |
| 5,525,817 A | * | 6/1996 | Hill et al. ................. 257/197 |
| 5,567,289 A | | 10/1996 | Taylor et al. |
| 5,573,596 A | | 11/1996 | Yin |

(Continued)

FOREIGN PATENT DOCUMENTS

JP    59-076559    5/1984

(Continued)

OTHER PUBLICATIONS

J.F. Shackelford, Introduction to Materials Science for Engineers; 4rd Ed. 1992, Macmillan Publishing Co., p. 757.

(Continued)

*Primary Examiner* — Rudy Zervigon
(74) *Attorney, Agent, or Firm* — Dugan & Dugan, PC

(57) ABSTRACT

A shadow frame and framing system for semiconductor fabrication equipment comprising a rectangular frame having four edges, the edges forming an interior lip with a top surface and an bottom engagement surface; and a cross beam disposed between at least two edges of the frame, the cross beam having a top surface and a bottom engagement surface, the engagement surface of the cross beam configured to be flush with the engagement surface of the lip; wherein one or more of the engagement surfaces are configured to cover metal interconnect bonding areas on a carrier disposed below the frame. The shadow frame is particularly useful in plasma enhanced chemical vapor deposition (PECVD) applications used to make active matrix liquid crystal displays (AMLCDs) and solar cells.

12 Claims, 2 Drawing Sheets

U.S. PATENT DOCUMENTS

| | | | |
|---|---|---|---|
| 5,611,865 | A | 3/1997 | White et al. |
| 5,720,818 | A | 2/1998 | Donde et al. |
| 5,863,396 | A * | 1/1999 | Flanigan ............... 204/298.11 |
| 5,885,751 | A * | 3/1999 | Weidman et al. ............ 430/315 |
| 5,895,549 | A | 4/1999 | Goto et al. |
| 5,942,042 | A | 8/1999 | Gogh |
| 5,976,989 | A | 11/1999 | Ishiguro |
| 6,074,488 | A | 6/2000 | Roderick et al. |
| 6,270,859 | B2 | 8/2001 | Zhao et al. |
| 6,355,108 | B1 | 3/2002 | Won et al. |
| 6,365,495 | B2 | 4/2002 | Wang et al. |
| 6,406,925 | B1 | 6/2002 | Athavale et al. |
| 6,494,958 | B1 | 12/2002 | Shamouilian et al. |
| 6,499,427 | B1 | 12/2002 | Yamazaki et al. |
| 6,528,751 | B1 | 3/2003 | Hoffman et al. |
| 6,554,954 | B2 | 4/2003 | Ma et al. |
| 6,960,263 | B2 | 11/2005 | Tanaka et al. |
| 7,501,161 | B2 | 3/2009 | Hou et al. |
| 2003/0106646 | A1 | 6/2003 | Ma et al. |
| 2003/0205327 | A1 | 11/2003 | Howald et al. |
| 2005/0120960 | A1 | 6/2005 | Chen |

FOREIGN PATENT DOCUMENTS

| | | |
|---|---|---|
| JP | 62-204322 | 12/1987 |
| JP | 06-340975 | 12/1994 |
| JP | 07-197248 | 8/1995 |
| JP | 08-092739 | 4/1996 |
| JP | 08-293539 | 11/1996 |
| JP | 09-171113 | 6/1997 |
| JP | 10-280154 | 10/1998 |
| JP | 10-298738 | 11/1998 |
| JP | 2001-196309 | 7/2001 |
| JP | 2001-329366 | 11/2001 |
| JP | 2003-100713 | 4/2003 |
| JP | 2003-100851 | 4/2003 |
| KR | 2001-0012878 | 2/2001 |
| WO | WO 98/53482 A1 | 11/1998 |

OTHER PUBLICATIONS

Korean Application No. 10-2003-0026368, now Korean Patent #648322 OA dated May 18, 2006.
Preliminary Amendment of U.S. Appl. No. 10/136,249, filed Jul. 8, 2002.
Office Action of U.S. Appl. No. 10/136,249 mailed Jul. 2, 2003.
Jan. 2, 2004 Response to Office Action of U.S. Appl. No. 10/136,249 mailed Jul. 2, 2003.
Final Office Action of U.S. Appl. No. 10/136,249 mailed Mar. 24, 2004.
Jun. 24, 2004 Response to Final Office Action of U.S. Appl. No. 10/136,249 mailed Mar. 24, 2004.
Advisory Action of U.S. Appl. No. 10/136,249 issued Jul. 19, 2004.
Nov. 29, 2004 Appeal Brief of U.S. Appl. No. 10/136,249.
Notice of Defective Appeal Brief of U.S. Appl. No. 10/136,249 issued Feb. 3, 2005.
Mar. 3, 2005 Appeal Brief of U.S. Appl. No. 10/136,249.
Notice of Allowance of U.S. Appl. No. 10/136,249 mailed Jun. 3, 2005.
Office Action of U.S. Appl. No. 10/858,267 mailed Jul. 27, 2006.
Dec. 27, 2006 Response to Office Action of U.S. Appl. No. 10/858,267 mailed Jul. 27, 2006.
Notice of Non-Compliant Amendment of U.S. Appl. No. 10/858,267 mailed Jan. 18, 2007.
Feb. 7, 2007 Response to Notice of Non-Compliant Amendment of U.S. Appl. No. 10/858,267 mailed Jan. 18, 2007.
Notice of Non-Compliant Amendment of U.S. Appl. No. 10/858,267 mailed May 1, 2007.
May 17, 2007 Response to Notice of Non-Compliant Amendment of U.S. Appl. No. 10/858,267 mailed May 1, 2007.
Final Office Action of U.S. Appl. No. 10/858,267 mailed Aug. 8, 2007.
Dec. 5, 2007 Response to Final Office Action of U.S. Appl. No. 10/858,267 mailed Aug. 8, 2007.
Advisory Action of U.S. Appl. No. 10/858,267 issued Dec. 17, 2007.
Jan. 8, 2008 Amendment filed with RCE of U.S. Appl. No. 10/858,267.
Office Action of U.S. Appl. No. 10/858,267 mailed Mar. 17, 2008.
Jul. 17, 2008 Response to Office Action of U.S. Appl. No. 10/858,267 mailed Mar. 17, 2008.
Notice of allowance of of U.S. Appl. No. 10/858,267 mailed Nov. 18, 2008.
Office Action of Japanese Application No. 2003-122713 mailed Apr. 7, 2009.
Restriction Requirement of U.S. Patent Application No. 10/858,267 (86581Y02) mailed Apr. 3, 2006.
May 3, 2006 Response to Restriction Requirement of U.S. Patent Application No. 10/858,267 (8658/Y02) mailed 4-32006.

* cited by examiner ion Ser.
SHADOW FRAME WITH CROSS BEAM FOR SEMICONDUCTOR EQUIPMENT This application is a division of U.S. patent application Ser. No. 10/136,249, filed Apr. 25, 2002 now U.S. Pat. No. 6,960, 263 which is hereby incorporated by reference herein in its entirety.

FIELD OF THE INVENTION

The invention pertains to the field of semiconductor processing equipment, and more particularly to a shadow framing system for use in semiconductor manufacturing over a large substrate or carrier.

BACKGROUND INFORMATION

Large panel displays, such as those manufactured with thin film technology (hereinafter "TFT"), are used in a wide variety of electronic applications as a display device for presenting information to a user. Such displays, for instance active matrix liquid crystal displays (hereinafter "AMLCDs") are often manufactured on a glass substrate (or over a carrier, which supports a substrate) of approximately 550 by 650 centimeters in dimension. In an exemplary environment, the displays comprise arrays of red, blue and green electronic cells that are driven through one or more grids of control lines.

The control lines are driven by control electronics elements, which are mounted to the substrate in one or more contact regions (metallization regions) on the upper surface of the substrate. The contact regions are generally free of semiconductor materials, such as SiN, a-Si, n+ Si, and Si films, these having been removed in semiconductor processing steps when the cell electronics were formed.

As the control electronics elements drive the control lines, the control lines in turn send signals to the cells. The signals electrically charge transistor lines in the cells, which cause a colored beam of light to be emitted. When several cells are combined, a spectrum of colors representing a discernable image will be created.

A shadow frame is occasionally employed in the semiconductor equipment that creates the large panel displays (that is, the equipment that deposits and etches semiconductor materials onto a substrate to create the TFT cells). In known systems, the shadow frame is a rectangularity shaped rim or lip that extends over the outer edges of a substrate and into the central deposition area approximately three to five millimeters. The shadow frame helps to hold the substrate in place and, in some cases, protects the substrate from warping and from deposition of material on the edges and backside of the substrate.

Some semiconductor equipment includes a shadow frame, while other equipment does not. For instance, the AKT, Inc., an of Applied Materials company, currently ships large panel display manufacturing units (e.g. the AKT 1600, 3500, 4300 and 5500 systems) that include a shadow frame, similar to what is described above, in the plasma enhanced chemical vapor deposition (hereinafter "PECVD") process chamber.

SUMMARY

A shadow frame for a semiconductor fabrication comprising a rectangular frame having four edges, the edges forming a lip with a top surface and an bottom engagement surface; and a cross beam disposed between at least two edges of the frame, the cross beam having a top surface and a bottom engagement surface, the engagement surface of the cross beam configured to be flush with the engagement surface of the lip; wherein one or more of the engagement surfaces are configured to cover metal interconnect bonding areas on a substrate disposed below the frame.

According to a preferred embodiment, the shadow frame of claim 1, wherein the cross beam is constructed of a thin, glass-like material including sapphire, while the frame is constructed of aluminum in which the outer surface has been anodized. According to another embodiment, the edges of the cross beam and lips are beveled to promote a smooth laminar flow of materials over a substrate disposed beneath the frame.

In another embodiment, the shadow frame is part of an overall framing system for a plasma enhanced chemical vapor deposition chamber, which further includes a susceptor disposed below the frame and configured to support the substrate against the frame, the susceptor including apertures, the apertures positioned below the engagement surfaces of the frame; and support elements including an engagement surface, the support elements configured to protrude through the apertures and contact a lower surface of the substrate at the engagement surface of the support elements.

These and other embodiments are described in the detailed description below and set forth in the claims that follow the detailed description.

DETAILED DESCRIPTION OF THE PREFERRED EMBODIMENTS

A shadow framing system is disclosed. According to an aspect of the system, an improved shadow frame comprises a rectangular perimeter yielding a generally open area, and one or more cross beams extending across the open area, dividing it into a plurality of smaller open regions. Each of the smaller open regions is configured to allow deposition of semiconductor materials so that an individual display can be created.

According to one embodiment, the perimeter is constructed of anodized aluminum and the cross beam of thin, rigid, glass-like material, such as sapphire. A planar surface of the shadow frame is configured to intimately engage a planar surface of the substrate. According to an aspect of the inventions, the cross beam is positioned so that it covers a metal interconnect bonding area where control circuitry will be connected to the display.

According to one embodiment, the shadow framing system further includes a susceptor. The susceptor is disposed below the shadow frame and is configured to support the substrate (or carrier supporting the substrate) and place the substrate intimately against the engaging surface of the shadow frame. The susceptor includes a plurality of apertures through which support elements can extend. The apertures are positioned such that they do not reside below any critical open area of the frame.

In the susceptor's disengaged state, the engaging surface of the susceptor is positioned below the engaging surface of the support elements. As the substrate is moved into the process chamber of the semiconductor fabrication equipment, it is robotically placed on top of the engaging surface of the support elements. The susceptor is then moved in an upwardly direction until the engaging surface of the susceptor is flush with the engaging surface of the support elements. From this position, the substrate is thrust upward farther still until a top surface of the substrate intimately engages the engaging surface of the shadow frame. As the susceptor continues upwardly, so too do the support elements, so that the engaging surfaces of the susceptor and support structures maintain their flush alignment with a bottom surface of the substrate.

These and other aspects of embodiments of the shadow framing system are disclosed in greater detail below, with reference to accompanying figures. The embodiments, like the figures, are meant to be illustrative of embodiments of the methods and systems described herein, but not their only embodiments. Further, we note that the embodiments shown in the figures are not to scale and the dimensions provided are not intended to be limiting, except as specifically recited in the claims.

Figure 1:
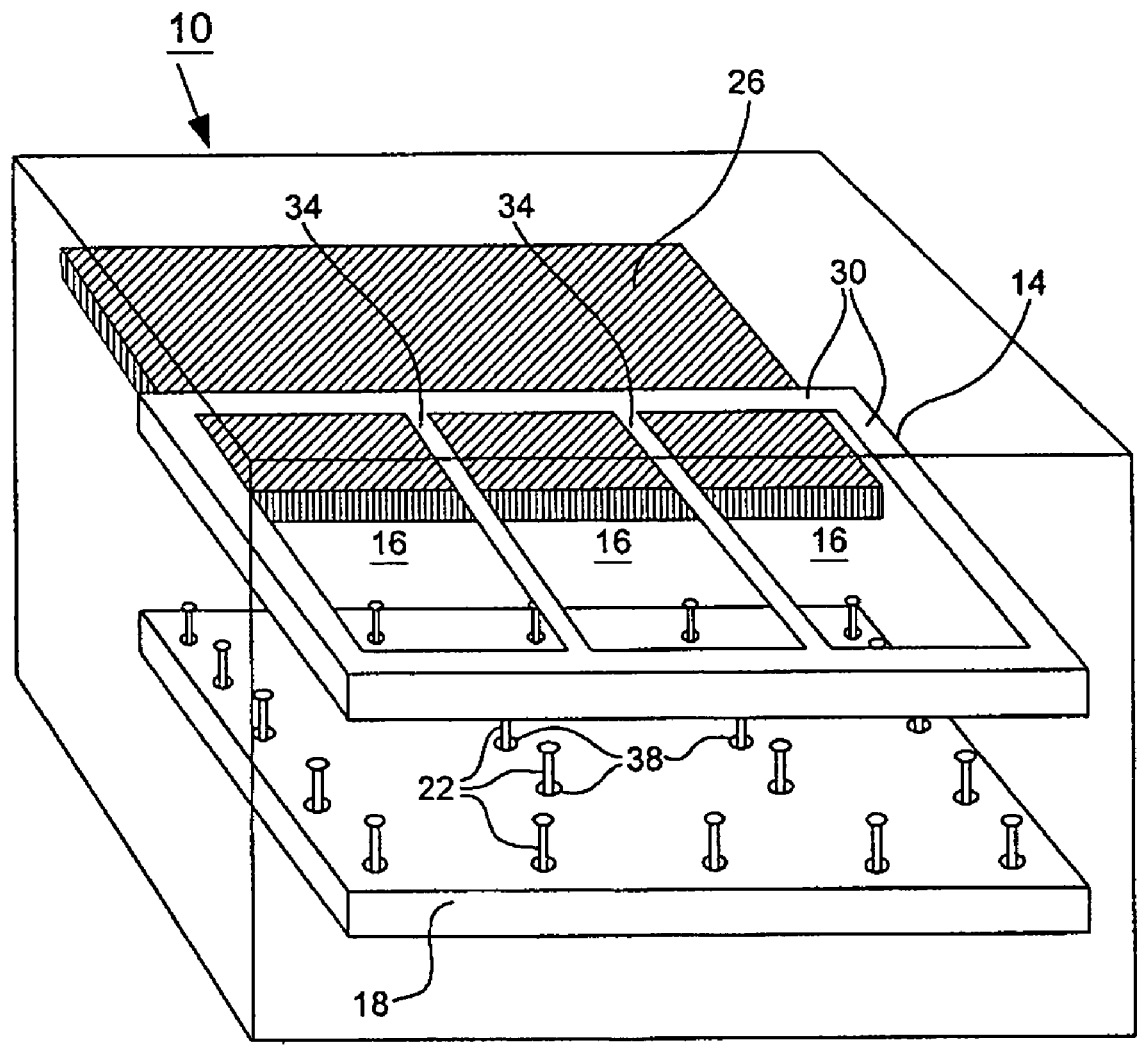
FIG. 1 is a perspective drawing of the improved shadow framing system.
Figure 2:
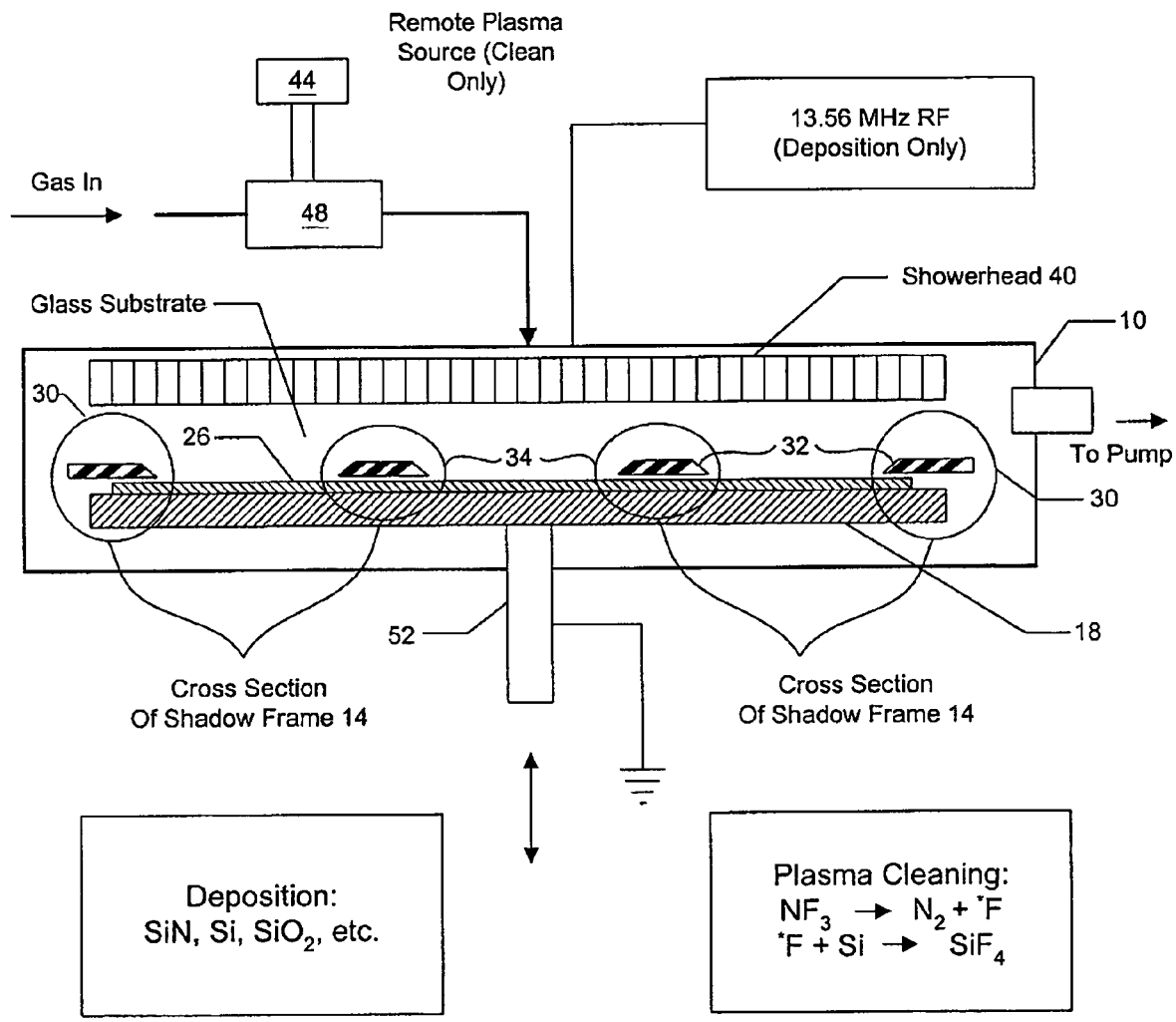
FIG. 2 is a side view of a PECVD process chamber.

Turning first to FIG. 1, it depicts an embodiment of the improved shadow frame system, shown here in representative chamber 10. (We note that not all the parts or elements of a chamber are shown, rather only those needed to conceptually understand our disclosure are depicted.) The system includes a shadow frame 14 and a susceptor 18. According to an aspect of the invention, the shadow frame 14 has a rectangular profile with overlapping edges (or "lips") 30 that extend, preferably, approximately two centimeters (as opposed to two to five millimeters) into the interior/central area of the frame 14. The overlapping edges 30 preferably have a beveled cross section at their edges, as is shown in FIG. 2 (described below).

Between opposing edges 30, lie one or more cross beams 34. The cross beams 34 define a plurality of open regions 16, into which semiconductor materials can be deposited onto a substrate. While not shown in FIG. 1, the bottom surfaces of the edges 30 and cross beams 34 are preferably coplanar, so that they act as a flush engaging surface to the top surface of a carrier, such as a substrate 26, which will be pressed against the frame 14 by the susceptor 18.

According to one embodiment, the cross beams 34, like the edges 30, can be beveled. An objective here, as was the case with the edges 30, is to provide a configuration of the area above the top surface of the substrate 26 that allows for an even flow of materials from the showerhead (FIG. 2), over the frame 14, and onto the top surface of the substrate 26.

According to one embodiment, the cross beams have a width of, preferably, approximately two centimeters and a thickness of less than approximately 1 millimeter, or more preferably a width of less than 2.0 centimeters and a thickness of less than 0.7 millimeters. Our experiments have found that the thinner the cross beam 34, the better the performance of the equipment. Further, we have found that anodized aluminum is an acceptable material for the major portions of the frame 14, e.g. the edges 30, while a ceramic or glass-like material is acceptable for the cross beam 34. However, the cross beam 34 should be generally rigid and capable of withstanding the environmental conditions known to the PECVD process chamber. One material that can be acceptable and conform to this preference is sapphire.

The cross beams 34 and edges 30 can be mechanically coupled through a variety of connection means. For instance, the edges 30 can have recesses into which the ends of the cross beams 34 rest, the cross beam 34 ends themselves capable of having recessed regions so that a flush joint is formed on the engagement surface of the frame. A fastening, clamping, or bonding mechanism, which is capable of withstanding the environmental conditions of the chamber and not disrupting the gaseous flow, can secure that cross beams 34 to the edges 30. As well, a support structure (not shown) can be included above the cross beams 34 to add rigidity where the weight of the cross beam 34 may be more than the cross beam's 34 physical structure can safely support.

According to one embodiment, the frame 14 is secured in a fixed position within the process chamber 10, while the susceptor 18 and other substrate engaging components move relative to the frame 14.

Turning to the susceptor 18, it is typically a resistively heated plate upon which the substrate 26 is supported. According to one embodiment, the susceptor includes a plurality of apertures 38. Extending through each aperture 38 is a support element 22 (or "lift pin"), the support elements 22 resembling a golf tee. The support elements have a flat upper surface (also called an "engagement surface") with a support rod beneath the engagement surface.

When a substrate 26 is robotically placed into the chamber 10, the susceptor 18 is in its disengaged, or lowest position. The support elements 22, however, are erect—protruding through the apertures 38. The robotic placement mechanism (not shown) places the substrate over the engagement surfaces of the support elements 22. (This placement typically occurs as the substrate 26 is transferred from the vacuum robot end effector (also not shown) to the susceptor 18.) Once the substrate 26 is in place, the susceptor 18 is forced in an upwardly direction until the top surface (or engagement surface) of the susceptor 18 makes intimate contact with the bottom surface of the substrate 26. At this point, the engagement surfaces of the support elements 22 and the susceptor 18 are coplanar.

Experimental results identified transistor issues (e.g., non-uniformities in SiN, a-Si and n+ Si films) in areas on the substrate 26 directly over the support elements 22. The non-uniformities, in turn, caused inconsistencies in the threshold voltages of the TFTs in the effected areas. However, we discovered that by placement of the support elements 22 in areas beneath the cross beams 34 and edges 30, these issues were resolved. Preferably, and so that the ultimate product is of the highest quality, the support elements 22 should be likewise placed in an area where a non-uniformity will not be of significance, if of any significance at all. For example, the support elements 22 and aperture 38 placement can be along the cut lines of the substrate 26.

In order to accommodate various configurations of the frame 14, namely the cross beam 34 positioning, it can also be preferable to not locate the support elements 22 in the central areas of the susceptor 18, but rather to place them on the peripheral areas of the susceptor 18. In such an embodiment, the peripheral support elements 22 should be lengthened to accommodate additional sag caused by the weight of the substrate 26.

Further, a power lift step, which can reduce static charge between the substrate 26 and the susceptor 18, can be modified, as well the transfer height of the substrate 26 can be adjusted. One embodiment of a power lift step is disclosed in U.S. Pat. No. 5,380,566, issued Jan. 10, 1995, and entitled "METHOD OF LIMITING STICKING OF BODY TO SUSCEPTOR IN A DEPOSITION TREATMENT", invented by Robert Robertson, et al., and commonly assigned with the subject application. U.S. Pat. No. 5,380,566 is incorporated herein by reference in its entirety.

Returning to the susceptor 18, it continues the upward drive of the substrate 26 until the top surface of the substrate 26 makes intimate contact with the lower surface (the engagement surface) of the cross beams 34 and edges 30. At this point, gravity secures the substrate 26 between the shadow frame 14 and the susceptor 18. Once secured in place, the PECVD process begins and materials (e.g. gate silicon nitride and amorphous silicon film) are deposited onto the substrate 26.

When the deposition process is complete, the susceptor 18 is lowered into its disengaged state and the substrate 26 is remove from the chamber 10 in a process similar to the manner in which it was placed into the chamber 10. After the manufacture of the display is complete, the substrate 26 will be cut along cut lines on the substrate 26. Preferably, these cut lines are directly below the regions where the cross beams 34 covered the top surface of the substrate 26.

Turning next to FIG. 2, it is a cross section of a PECVD process chamber 10, including attendant components. We note again that the drawing is not to scale and certain editorial changes are made to emphasize different components. For instance, the engagement surfaces of the frame 14, that is the edges 30 and cross beams 34, are not shown making intimate contact with the top surface of the substrate 26—this is just to draw out the components. Of course, such a view may look as is shown in FIG. 2 prior to the susceptor 18 pressing the substrate 26 against the engagement surfaces of the frame 14.

A remote plasma source 44 and a gas supply are combined in a chamber 48, from which materials flow to the process chamber 10 through a showerhead 40. As the materials exit the showerhead 40, the flow may first encounter the top surfaces of the cross beams 34 and edges 30 of the frame 14. It is from this angle that the bevel 32 on the edges of the cross-beams 34 and edges 30 is best seen.

The material flow will then be deposited through the open regions 16 created between the cross beams 34 and edges 30 of the frame 14 and onto the top, exposed surfaces of the substrate 26, as well as onto the top, exposed surfaces (the non-engagement surfaces) of the cross beams 34 and edges 30.

As the processes continue, materials will build up on the substrate 26 forming electronic circuitry. However, material will not be deposited on the portions of the substrate 26 that are intimately mated with the engagement surfaces of the frame 14. According to an aspect of the inventions, the cross beam 34 and edge 30 engagement surfaces cover the metal interconnect bonding areas where control circuitry will be mounted.

This deposition characteristic, that is of protecting the metal interconnect bonding area, has several advantages. First, the metal contact areas of the gate metal and source/drain metal are not covered with a passivation layer. Thus, direct bonding contact can be made to the metal connection pads at the periphery of the display by bonding to the metal patterning the passivation layer though lithography and etching. Second, it reduces the number of steps involved in the semiconductor manufacturing process. For instance, a typical process to manufacture a back channel TFT involves four to six photolithography masks. These masks include a gate metal mask, an active layer mask, a contact mask, a source/drain conductor mask, and a passivation mask. Improvement is found in our systems in that a passivation masking step can be eliminated from the manufacturing process. This, in turn, can increase the yield of process, as fewer steps lead to fewer defects, can reduce the number of the photolithography printing tools required, and can reduce the production time (or increase the throughput) of the production process.

To complete the description of the chamber 10: the substrate 26 is held between the engagement surfaces of the frame 14 and the susceptor 18. The susceptor 18, which is resistively heated, is connected to a shaft 52, which moves in a vertical direction and electrically couples the susceptor 18 to ground.

There will be a build up of materials on the cross beams 34 and edges 30 of the frame 14. To prevent this build up from interfering with or adding impurities to the semiconductor processing steps, it is recommended that the process chamber 10, namely the non-engagement surfaces of the frame 14 be cleaned to prevent material buildup. Such a cleaning should take place each time the buildup reaches two to three microns in thickness. While semiconductor processes vary, this will typically occur between three and ten depositions and can be set by control software monitoring the fabrication process.

To clean the chamber, we recommended that reactive fluorine atoms from a remote plasma discharge of $NF_3$ be forced through the showerhead 40. The fluorine atoms will react with the deposition material and can be pumped out of the chamber 10 with a vacuum pump.

Depicted in FIGS. 1-2 are exemplary embodiments of the improved shadow frame with one or more cross beams. We only show an overall view of the improved shadow frame with the understanding that one of skill in the art could modify the interconnection or precise dimensions in accordance with the description provided above, or in accordance with a particular application in which the inventions can be employed.

Above, we have described a shadow framing system with reference to a PECVD process chamber used in the manufacture of AMLCDs. This, however, should not limit the application of the claims below to other processes or applications, unless otherwise specifically limited therein.

For example, the systems and methods described above can be equally well applied to the manufacture of solar cells with semiconductor fabrication equipment. In such systems, the solar cells are manufactured on a substrate (or a carrier supporting a substrate), in which 25-50 wafers are cut from the carrier after processing. The above shadow framing system can be configured with cross beams to frame each of the wafers and protect the wafers from the deposition of, for instance, an amorphous silicon film.

What is claimed is:

1. A method of depositing a material layer on a substrate comprising:
    providing a shadow framing system having:
        a rectangular frame including at least one cross beam, the rectangular frame and cross beam having flush engagement surfaces configured to intimately contact a substrate disposed below the rectangular frame, and further configured to cover a metal interconnect area of the substrate;
        a susceptor disposed below the rectangular frame and configured to support the substrate against the rectangular frame, the susceptor including apertures, the apertures positioned below the engagement surfaces of the rectangular frame; and
        support elements including an engagement surface, the support elements configured to protrude through the apertures and contact a lower surface of the substrate at the engagement surface of the support elements;
    retracting the susceptor below the support elements;
    placing a substrate on the support elements;
    raising the susceptor so that the susceptor contacts the substrate; and
    depositing a material layer on the substrate through the rectangular frame.

2. A method comprising:
    providing a shadow frame for semiconductor fabrication equipment having:
        a rectangular frame having four edges, the edges forming a lip with a top surface and a bottom engagement surface; and
        at least one cross beam disposed between at least two edges of the frame, the cross beam having a top surface and a bottom engagement surface, the engagement surface of the cross beam configured to be flush with the engagement surface of the lip;

wherein one or more of the engagement surfaces are configured to cover metal interconnect bonding areas on a substrate disposed below the frame;

wherein the engagement surfaces are also disposed to be positioned over support elements adapted to lift the substrate; and employing the shadow frame during fabrication of a panel display.

3. The method of claim 1, wherein the material layer is deposited on the substrate in an open region defined by the position of the cross beam in the rectangular frame.

4. The method of claim 1, wherein the apertures in the susceptor are positioned such that they are aligned with areas beneath the cross beam and rectangular frame.

5. The method of claim 1, wherein at least one of the support elements is disposed along a periphery of the susceptor.

6. The method of claim 1 wherein the rectangular frame and cross beam comprise a beveled top surface to allow laminar flow of materials onto the substrate.

7. The method of claim 1, wherein the susceptor is adapted to heat the substrate supported by the susceptor.

8. The method of claim 2, wherein the top surfaces of the rectangular frame and the cross beam are beveled to allow laminar flow of materials onto the substrate.

9. The method of claim 2 wherein the edges of the rectangular frame are beveled.

10. The method of claim 2 wherein the top surface of the cross beam is beveled.

11. The method of claim 2 wherein the bottom surface of the edges and the bottom surface of the cross beam are coplanar.

12. The method of claim 2, wherein the frame is secured in a fixed position.

* * * * *